(12) United States Patent
Shi

(10) Patent No.: US 10,756,273 B2
(45) Date of Patent: Aug. 25, 2020

(54) FABRICATING A PLURALITY OF LAYERS IN AN OLED DEVICE BY A SOLUTION FILM METHOD

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Ting Shi, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 156 days.

(21) Appl. No.: 15/579,553

(22) PCT Filed: Nov. 20, 2017

(86) PCT No.: PCT/CN2017/111968
§ 371 (c)(1),
(2) Date: Dec. 4, 2017

(87) PCT Pub. No.: WO2019/061753
PCT Pub. Date: Apr. 4, 2019

(65) Prior Publication Data
US 2019/0229298 A1    Jul. 25, 2019

(30) Foreign Application Priority Data
Sep. 29, 2017  (CN) .......................... 2017 1 0911807

(51) Int. Cl.
*H01L 21/00*   (2006.01)
*H01L 51/40*   (2006.01)
(Continued)

(52) U.S. Cl.
CPC ...... *H01L 51/0037* (2013.01); *H01L 27/3246* (2013.01); *H01L 51/0004* (2013.01);
(Continued)

(58) Field of Classification Search
CPC ............. H01L 27/3246; H01L 51/0037; H01L 51/5072; H01L 51/5088; H01L 51/5012; H01L 51/0004; H01L 51/5056
See application file for complete search history.

(56) References Cited

U.S. PATENT DOCUMENTS

2005/0062050 A1 * 3/2005 Mizuno ............... H01L 51/5012
                                                                257/79
2011/0240965 A1 * 10/2011 Yoon ................... H01L 27/3211
                                                                257/40
(Continued)

FOREIGN PATENT DOCUMENTS

CN           107256882        12/2010
CN           104821374         8/2015
(Continued)

*Primary Examiner* — Alonzo Chambliss
(74) *Attorney, Agent, or Firm* — Hemisphere Law, PLLC; Zhigang Ma

(57) ABSTRACT

The disclosure provides an all-solution OLED device and a manufacturing method thereof. The manufacturing method fabricate a hole injection layer, a hole transport layer, a light emitting layer, an electron transport layer, and a cathode by solution film-forming. Compared with the manufacturing method of the existing OLED device, an all-solution fabrication of the electron transport layer and the cathode is achieved, the use of high vacuum evaporation process and equipment can be avoided, thereby saving materials and reducing manufacturing costs; and the adjacent layers will not appear mutual solubility, so the film quality is high and the device performance can be improved. The hole injection layer, the hole transport layer, the light emitting layer, the electron transport layer, and the cathode are all fabricated by
(Continued)

solution film-forming; and compared with the existing OLED device, the manufacturing cost is low, the film-forming quality is high, and the display quality is excellent.

11 Claims, 4 Drawing Sheets

(51) Int. Cl.
- *H01L 29/08* (2006.01)
- *H01L 31/0232* (2014.01)
- *H01L 33/00* (2010.01)
- *H01L 51/00* (2006.01)
- *H01L 51/56* (2006.01)
- *H01L 51/50* (2006.01)
- *H01L 27/32* (2006.01)

(52) U.S. Cl.
CPC ...... *H01L 51/5012* (2013.01); *H01L 51/5072* (2013.01); *H01L 51/5088* (2013.01); *H01L 51/56* (2013.01); *H01L 51/5056* (2013.01); *H01L 2227/323* (2013.01)

(56) References Cited

U.S. PATENT DOCUMENTS

| | | | |
|---|---|---|---|
| 2012/0097931 A1* | 4/2012 | Cho | H01L 51/0005 257/40 |
| 2014/0035839 A1 | 2/2014 | Cho | |
| 2014/0191209 A1* | 7/2014 | Han | H01L 27/3211 257/40 |
| 2014/0312339 A1* | 10/2014 | Fujita | H01L 27/322 257/40 |
| 2015/0155523 A1* | 6/2015 | Kamiya | H01L 51/5253 257/40 |
| 2015/0236075 A1* | 8/2015 | Jeong | H01L 27/3211 257/40 |
| 2015/0303384 A1* | 10/2015 | Kim | H01L 51/0059 257/40 |
| 2016/0056218 A1* | 2/2016 | Wang | H01L 27/3246 257/40 |

FOREIGN PATENT DOCUMENTS

| CN | 105140358 | 12/2015 |
|---|---|---|
| CN | 105742522 | 7/2016 |
| CN | 107086272 | 8/2017 |

* cited by examiner

FABRICATING A PLURALITY OF LAYERS IN AN OLED DEVICE BY A SOLUTION FILM METHOD

RELATED APPLICATIONS

The present application is a National Phase of International Application Number PCT/CN2017/111968, filed on Nov. 20, 2017, and claims the priority of China Application 201710911807.4, filed on Sep. 29, 2017.

FIELD OF THE DISCLOSURE

The disclosure relates to the field of display technology, in particular to an all-solution OLED device and a manufacturing method thereof. The disclosure relates to a display technical field, and more particularly to a display panel and a display device.

BACKGROUND

The organic light emitting diode (OLED) display apparatus is recognized by the industry as the most promising display device due to many advantages such as self-luminousness, low driving voltage, high luminous efficiency, short response time, high resolution and contrast, viewing angle nearly 180°, wide temperature range, and capability of achieving the flexible display and large-area panchromatic display.

According to the driving mode, OLED can be classified into a passive matrix OLED (PMOLED) and an active matrix OLED (AMOLED), i.e., direct addressing and thin film transistor matrix addressing. Among them, AMOLED has a matrix arrangement of pixels, belonging to the active display type; due to the high luminous efficiency, AMOLED is usually used for high-definition large-size display apparatus.

The OLED generally includes a substrate, an anode disposed on the substrate, a hole injection layer disposed on the anode, a hole transport layer disposed on the hole injection layer, and a light emitting layer disposed on the hole transport layer, an electron transport layer on the light emitting layer, and a cathode disposed on the electron transport layer. The principle of light-emitting OLED display devices is that emit light by carrier injection and recombination under an electric field. Specifically, an OLED display device generally adopts an ITO pixel electrode and a metal electrode as an anode and a cathode of the device respectively. Under a certain voltage, electrons and holes are injected from the cathode and the anode into the electron transport layer and the hole transport layer respectively; the electrons and holes migrate to the light emitting layer through the electron transport layer and the hole transport layer respectively, and meet in the light emitting layer to form excitons to excite the light-emitting molecules, which emit visible light through radiation relaxation.

The most common manufacturing method of the OLED device is that preparing a hole injection layer, a hole transport layer, and a light emitting layer by ink-jet printing and preparing an electron transport layer and a cathode by vacuum thermal evaporation; due to the high cost of the vacuum thermal evaporation, a high production cost of the OLED device is caused, so a large-scale commercialization of the OLED device is limited. The ink-jet printing method uses a plurality of nozzles to drop the ink of the functional material into a predetermined pixel area, and then the desired film is obtained by drying. The method has the advantages of high material utilization and the like, and is a key technology for solving the problem of the display cost of a large-size OLED. However, due to the mutual miscibility between the adjacent printing ink layers, and the materials of the electron transport layer and the cathode are mostly the evaporation materials, it is very difficult to achieve an all-solution-process OLED device.

SUMMARY

The object of the disclosure is to provide a manufacturing method of an all-solution OLED device. A hole injection layer, a hole transport layer, a light emitting layer, an electron transport layer and a cathode are fabricated by a solution film-forming method, so as to avoid the use of high vacuum evaporation process and equipment, thereby saving materials and reducing manufacturing costs.

The object of the disclosure is also to provide an all-solution OLED device, a hole injection layer, a hole transport layer, a light emitting layer, an electron transport layer and a cathode thereof are all fabricated by a solution film-forming method, so the manufacturing cost is low and the display quality is excellent.

In order to achieve the object, the disclosure provides a manufacturing method of an all-solution OLED device, including:

providing a TFT backplane, the TFT backplane includes a base substrate, a TFT array layer disposed on the base substrate, a plurality of anodes disposed on the array of the layers and disposed at intervals, and a pixel definition layer disposed on the TFT array layer and the plurality of anodes, and the pixel definition layer includes a plurality of openings respectively corresponding to the plurality of anodes;

providing an ink of a hole injection layer, performing a solution film formation on the plurality of anodes in the plurality of openings respectively by ink-jet printing or coating, and forming a plurality of hole injection layers by drying and removing a solvent;

providing an ink of a hole transport layer, performing a solution film formation on a plurality of hole injection layers in the plurality of openings respectively by ink-jet printing or coating, and forming a plurality of hole transport layers by drying and removing a solvent;

providing an ink of a light emitting layer, performing a solution film formation on the plurality of hole transport layers in the plurality of openings respectively by ink-jet printing or coating, and forming a plurality of light emitting layers by drying and removing the solvent;

providing an ink of an electron transport layer, performing a solution film formation on the plurality of light emitting layers in the plurality of openings respectively by ink-jet printing or coating, and forming a plurality of electron transport layers by drying and removing the solvent;

and the ink of the electron transport layer includes a material and a solvent of the electron transport layer, and the material of the electron transport layers is an ionic conjugated polyelectrolyte, and the solvent is an alcohol solvent;

providing a metal paste material, forming an entire surface of solution on the plurality of electron transport layers in the pixel definition layer and the plurality of openings respectively by ink-jet printing or coating, and forming a continuous uninterrupted cathode by drying and removing the solvent;

and the metal paste material includes metal microparticles, a binder, a solvent, and an auxiliary agent.

the areas of the plurality of openings are respectively smaller than the areas of the plurality of anodes; the plurality of openings respectively correspond to a plurality of pixel regions; the material of plurality of anodes is indium tin oxide; the plurality of anodes are fabricated by way of magnetron sputtering film formation, the film thickness of the plurality of anodes is between 20 nm and 200 nm;

the ink of the hole injection layer is a PEDOT:PSS aqueous solution; the solution film-forming method of the plurality of hole injection layers is ink-jet printing; a drying method of the plurality of hole injection layers includes one or two of vacuum drying and heat drying; and a thickness of the plurality of hole injection layers is between 1 nm and 100 nm.

the ink of the hole transport layer includes a hole transport layer material and a solvent thereof, the material of the hole transport layers is poly (N, N'-bis (4-butylphenyl)-N, N'-bis (phenyl) benzidine), and the solvent is an organic solvent; the solution film-forming method of the plurality of hole transport layers is ink-jet printing; a drying method of the plurality of hole transport layers includes one or two of vacuum drying and heat drying; and a thickness of the plurality of hole transport layers is between 1 nm and 100 nm;

the ink of the light emitting layer includes a light emitting layer material and a solvent, the material of the light emitting layer is a blue light emitting material, wherein the material of the blue light emitting layers includes poly(9,9-di-n-octylfluorenyl-2,7-diyl), and the solvent is an organic solvent; the plurality of light emitting layers. The solution film-forming method of the layer is ink-jet printing. the drying method of the plurality of light emitting layers includes one or two of vacuum drying and heat-drying. The film thickness of the plurality of light emitting layers is between 1 nm and 100 nm.

The ionic conjugated polyelectrolyte is a cationic conjugated polyelectrolyte and the cationic conjugated polyelectrolyte has a structural formula of

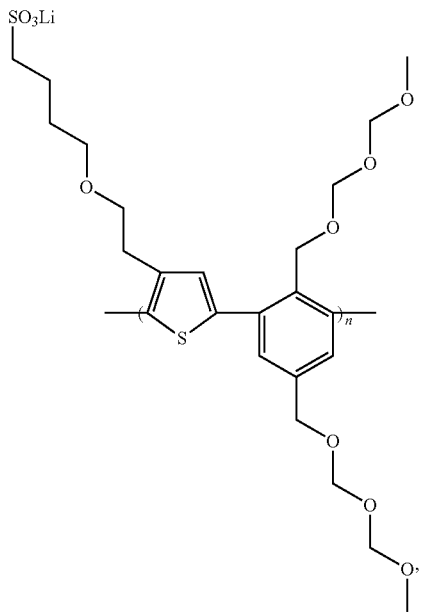

and the alcohol solvent is methanol;

the solution film-forming method of the plurality of electron transport layers is ink-jet printing; a drying method of the plurality of electron transport layers includes one or two of vacuum drying and heat drying; and a thickness of the plurality of electron transport layers is between 0.5 nm and 10 nm.

a material of the metal microparticles is silver; the solution film-forming method of the plurality of anodes is ink-jet printing; a drying method of the plurality of anodes includes one or two of the vacuum drying and the heat drying; a thickness of the plurality of anodes is between 10 nm and 200 nm; and a top of the pixel definition layer is a rough surface.

The disclosure further provides an all-solution OLED device, including: a base substrate, a TFT array layer disposed on the base substrate, a plurality of anodes disposed on the TFT array layer and disposed at intervals, a pixel definition layer disposed on the TFT array layer and the plurality of anodes, a plurality of openings disposed on the pixel definition layer and respectively corresponding to the plurality of anodes, a plurality of hole injection layers respectively disposed in the plurality of openings and located on the plurality of anodes, a plurality of hole transport layers respectively disposed in the plurality of openings and located on the plurality of hole injection layers, a plurality of light emitting layers respectively disposed in the plurality of openings and located on the plurality of hole transport layers, a plurality of electron transport layers respectively disposed in the plurality of openings and located on the plurality of light emitting layers, and a cathode covered on an entire surface of the pixel definition layer and the plurality of electron transport layers and distributed continuously and uninterruptedly;

the plurality of hole injection layers, the plurality of hole transport layers, the plurality of light emitting layers, the plurality of electron transport layers, and the cathode are fabricated by a solution film-forming method;

the material of the plurality of electron transport layers includes an ionic conjugated polyelectrolyte; and a material of the cathode includes metal microparticles and a binder.

the areas of the plurality of openings are respectively smaller than the areas of the plurality of anodes; the plurality of openings respectively correspond to a plurality of pixel regions; the material of the plurality of anodes is indium tin oxide; the plurality of anodes are fabricated by way of magnetron sputtering film formation, and the film thickness of the plurality of anodes is between 20 nm and 200 nm;

the material of the hole injection layer includes PEDOT: PSS; and a thickness of the hole injection layers is between 1 nm and 100 nm.

a material of the hole transport layer includes poly (N,N'-bis(4-butylphenyl)-N,N'-bis (benzeneyl)benzidine); a thickness of the plurality of hole transport layers is between 1 nm and 100 nm;

the light emitting layer is a blue light emitting layer, and a material of the blue light emitting layer includes poly(9, 9-di-n-octylfluorenyl-2,7-diyl); and a thickness of the plurality of light emitting layers is between 1 nm and 100 nm.

the ionic conjugated polyelectrolyte is a cationic conjugated polyelectrolyte and the cationic conjugated polyelectrolyte has a structural formula of

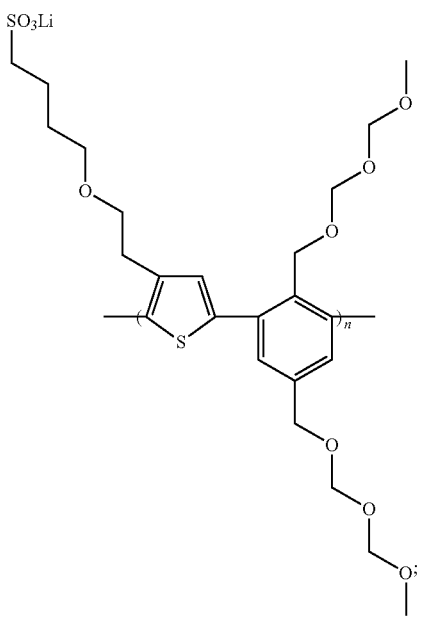

and a thickness of the plurality of electron transport layers is between 0.5 nm and 10 nm.

a material of the metal microparticles is silver; a thickness of the plurality of anodes is between 10 nm and 200 nm; and a top of the pixel definition layer is a rough surface.

The disclosure also provides an all-solution OLED device manufacturing method including:

providing a TFT backplane, the TFT backplane includes a base substrate, a TFT array layer disposed on the base substrate, a plurality of anodes disposed on the array of the layers and spaced TFT, and the TFT is provided A pixel definition layer on the array layer and the plurality of anodes, the pixel definition layer being provided with a plurality of openings respectively corresponding to a plurality of anodes;

providing an ink of a hole injection layer, performing a solution film formation on the plurality of anodes in the plurality of openings respectively by ink-jet printing or coating, and forming a plurality of hole injection layers by drying and removing a solvent;

providing an ink of a hole transport layer, performing a solution film formation on a plurality of hole injection layers in the plurality of openings respectively by ink-jet printing or coating, and forming a plurality of hole transport layers by drying and removing a solvent;

providing an ink of a light emitting layer, performing a solution film formation on the plurality of hole transport layers in the plurality of openings respectively by ink-jet printing or coating, and forming a plurality of light emitting layers by drying and removing the solvent;

providing an ink of an electron transport layer, performing a solution film formation on the plurality of light emitting layers in the plurality of openings respectively by ink-jet printing or coating, and forming a plurality of electron transport layers by drying and removing the solvent;

the ink of the electron transport layer includes an electron transport layer material and a solvent, the material of the electron transport layers is an ionic conjugated polyelectrolyte, and the solvent is an alcohol solvent;

providing a metal paste material, forming an entire surface of solution on the plurality of electron transport layers in the pixel definition layer and the plurality of openings respectively by ink-jet printing or coating, and forming a continuous uninterrupted cathode by drying and removing the solvent;

the metal paste material includes metal microparticles, a binder, a solvent, and an auxiliary agent;

and the areas of the plurality of openings are respectively smaller than the areas of the plurality of anodes; the plurality of openings respectively correspond to a plurality of pixel regions; the material of plurality of anodes is indium tin oxide; the plurality of anodes are fabricated by way of magnetron sputtering film formation, the film thickness of the plurality of anodes is between 20 nm and 200 nm;

the ink of the hole injection layer is a PEDOT:PSS aqueous solution; the solution film-forming method of the plurality of hole injection layers is ink-jet printing; a drying method of the plurality of hole injection layers includes one or two of vacuum drying and heat drying; and a thickness of the plurality of hole injection layers is between 1 nm and 100 nm;

the ink of the hole transport layer includes a hole transport layer material and a solvent thereof, the material of the hole transport layers is poly (N, N'- bis (4-butylphenyl)-N, N'- bis (phenyl) benzidine), and the solvent is an organic solvent; the solution film-forming method of the plurality of hole transport layers is ink jet printing; a drying method of the plurality of hole transport layers includes one or two of vacuum drying and heat drying; and a thickness of the plurality of hole transport layers is between 1 nm and 100 nm;

The ink of the light emitting layer includes a light emitting layer material and a solvent, the material of the light emitting layer is a blue light emitting material, the material of the blue light emitting layers includes poly(9,9-di-n-octylfluorenyl-2,7-diyl), and the solvent is an organic solvent; the solution film-forming method of the plurality of light emitting layers is ink-jet printing; a drying method of the plurality of light emitting layers includes one or two of vacuum drying and heat drying; and a thickness of the plurality of light emitting layers is between 1 nm and 100 nm;

the ionic conjugated polyelectrolyte is a cationic conjugated polyelectrolyte and the cationic conjugated polyelectrolyte has a structural formula of

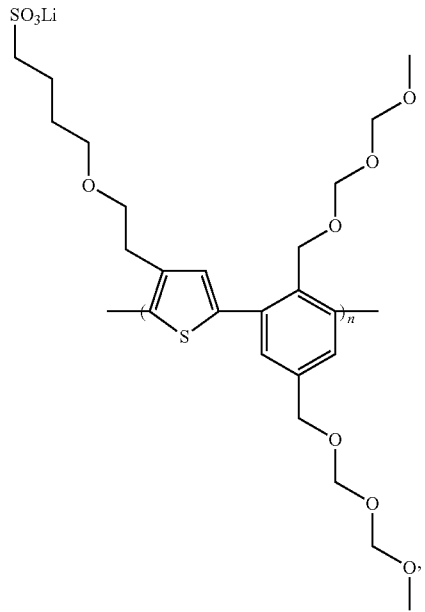

and the alcohol solvent is methanol;

the solution film-forming method of the plurality of electron transport layers is ink jet printing; a drying method of the plurality of electron transport layers includes one or two of vacuum drying and heat drying; and a thickness of the plurality of electron transport layers is between 0.5 nm and 10 nm;

and a material of the metal microparticles is silver; the solution film-forming method of the plurality of anodes is ink-jet printing; a drying method of the plurality of anodes includes one or two of the vacuum drying and the heat drying; a thickness of the plurality of anodes is between 10 nm and 200 nm; and a top of the pixel definition layer is a rough surface.

The beneficial effect of the disclosure is that the manufacturing method of the all-solution OLED device of the disclosure adopts the solution film-forming method to fabricate a hole injection layer, a hole transport layer, a light emitting layer, an electron transport layer and a cathode. Compared with the manufacturing method of the existing OLED device, an all-solution preparation of the electron transport layer and the cathode is achieved, the use of high vacuum evaporation process and equipment can be avoided, thereby saving materials and reducing manufacturing costs; and adjacent layers will not appear mutual solubility, so the film quality is high and the performance of the device can be improved. The hole injection layer, the hole transport layer, the light emitting layer, the electron transport layer, and the cathode are all fabricated by solution film-forming; compared with the existing OLED device, the fabrication cost is low, the film-forming quality is high, and the display quality is excellent.

For further understanding of the features and technical contents of the disclosure, reference should be made to the following detailed description and accompanying drawings of the disclosure. However, the drawings are for reference only and are not intended to limit the disclosure.

BRIEF DESCRIPTION OF THE DRAWINGS

The technical proposal of the disclosure and other advantageous effects will be apparent from the following detailed description of specific embodiments of the disclosure taken in conjunction with the accompanying drawings.

In the drawings.

DETAILED DESCRIPTION OF PREFERRED EMBODIMENTS

To further illustrate the technical means adopted by the disclosure and the effects thereof, the following describes in detail the preferred embodiments of the disclosure and the accompanying drawings.

Figure 1:
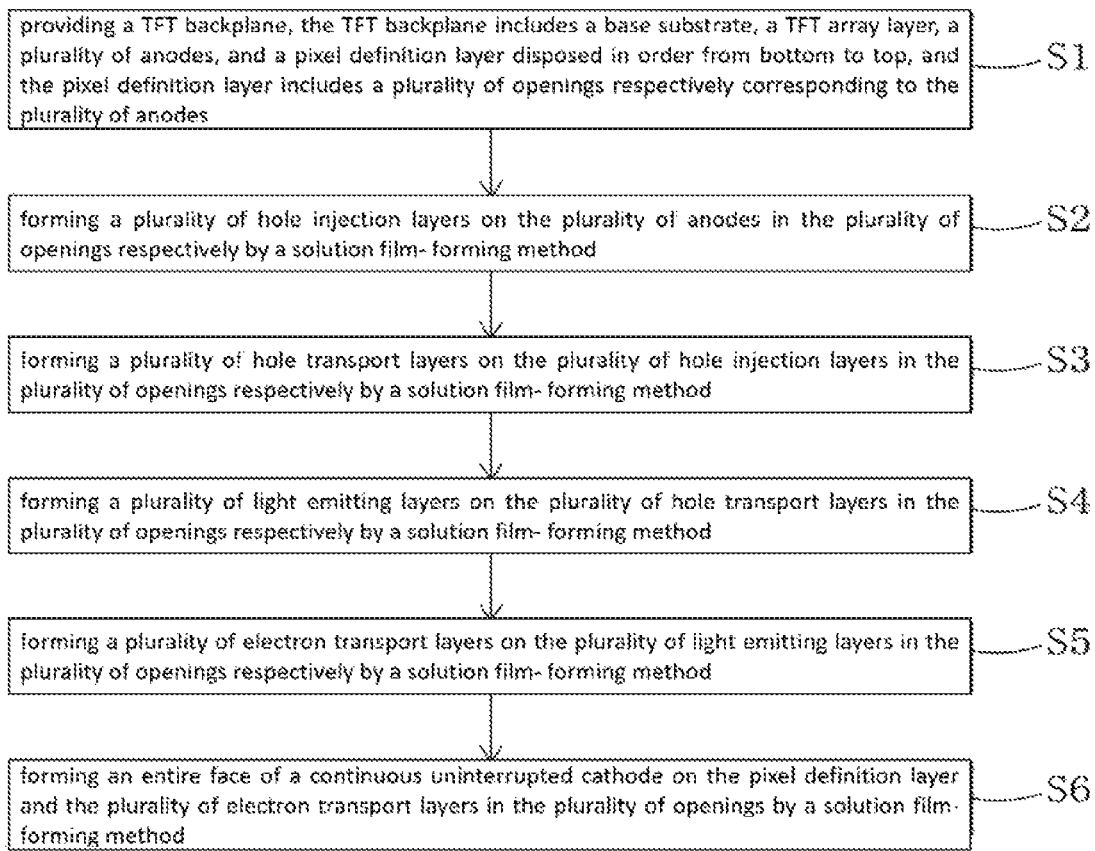
FIG. 1 is a flow chart of a manufacturing method of an all-solution OLED device of the disclosure.

Referring to FIG. 1, the disclosure provides a manufacturing method of an all-solution OLED device, including the steps as follows.

Figure 2:
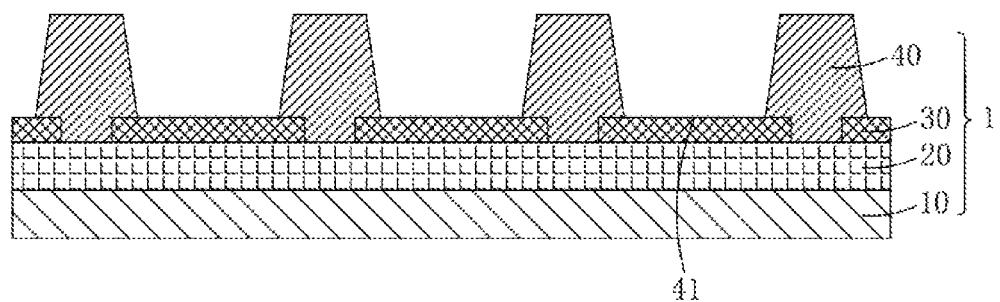
FIG. 2 is a schematic diagram of step S1 of the manufacturing method of an all-solution OLED device of the disclosure.

In step S1, as shown in FIG. 2, a TFT backplane 1 is provided. The TFT backplane 1 includes a base substrate 10, a TFT array layer 20 disposed on the base substrate 10, a plurality of anodes 30 disposed on the TFT array layer 20 and disposed at intervals, and a pixel definition layer 40 disposed on the TFT array layer 20 and the plurality of anodes 30, and the pixel definition layer 40 includes a plurality of openings 41 respectively corresponding to the plurality of anodes 30.

Specifically, the plurality of openings 41 respectively correspond to a plurality of pixel regions.

Specifically, the areas of the openings 41 are respectively smaller than the areas of the plurality of anodes 30, ensuring that the bottoms of the openings 41 are covered with the anode material.

Specifically, the material of the plurality of anodes 30 is indium tin oxide(ITO). The plurality of anodes 30 are fabricated by way of magnetron sputtering film formation, and the film thickness of the plurality of anodes 30 is between 20 nm and 200 nm.

Figure 3:
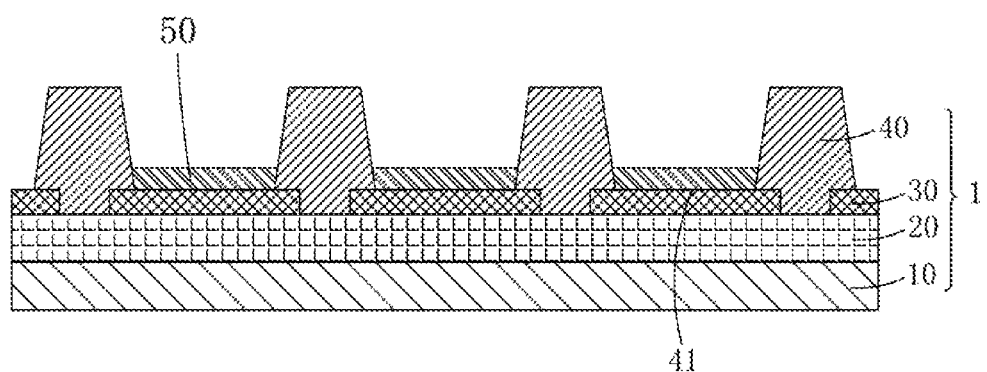
FIG. 3 is a schematic diagram of step S2 of the manufacturing method of an all-solution OLED device of the disclosure.

In step S2, as shown in FIG. 3, an ink of the hole injection layer is provided. A solution film formation is performed respectively on the plurality of anodes 30 in the plurality of openings 41 by ink-jet printing or coating, and a plurality of hole injection layers 50 are formed by drying and removing the solvent.

Specifically, the ink of the hole injection layer is a PEDOT:PSS aqueous solution.

Preferably, the solution film-forming method of the plurality of hole injection layers 50 is ink-jet printing.

Specifically, the drying method of the plurality of hole injection layers 50 includes one or two of vacuum drying and heat drying. Preferably, the drying method of the plurality of hole injection layers 50 is vacuum drying.

Specifically, the thickness of the hole injection layers 50 is between 1 nm and 100 nm.

Figure 4:
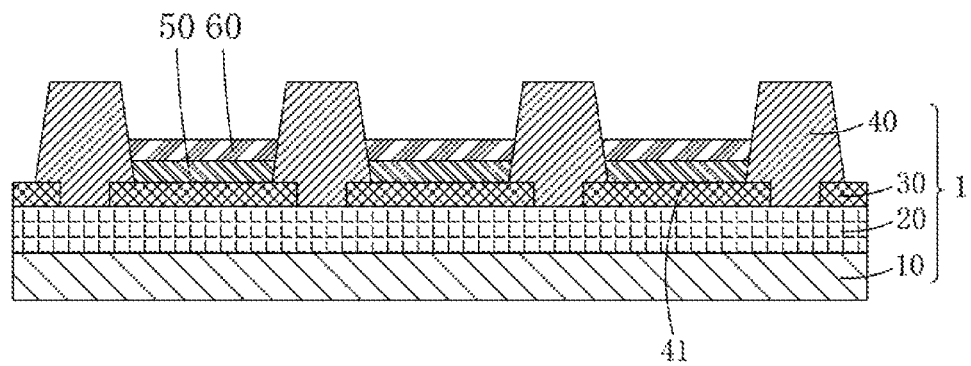
FIG. 4 is a schematic diagram of the step S3 of the manufacturing method of an all-solution OLED device of the disclosure.

In step S3, as shown in FIG. 4, an ink of the hole transport layer is provided. A solution film formation is performed respectively on the plurality of hole injection layers 50 in the plurality of openings 41 by ink-jet printing or coating, and a plurality of hole transport layers 60 are formed by drying and removing the solvent.

Specifically, the ink of the hole transport layer includes a hole transport layer material and a solvent, and the material of the hole transport layers is poly(N,N'-bis (4-butylphenyl)-N,N'-bis(phenyl)-benzidine)(Poly-TPD), and the solvent is an organic solvent; preferably, the organic solvent includes one or more of toluene, chloroform, and chlorobenzene.

Preferably, the solution film-forming method of the plurality of hole transport layers 60 is ink jet printing.

Specifically, the drying method of the plurality of hole transport layers 60 includes one or two of vacuum drying and heat drying. Preferably, the drying method of the plurality of hole transport layers 60 is vacuum drying.

Specifically, the thickness of the hole transport layer 60 is between 1 nm and 100 nm.

Since the material PEDOT:PSS of the hole injection layer 50 is water-soluble and the material of the hole transport layer Poly-TPD is organic solvent-dissolving, the hole injection layer 50 and the hole transport layer 60 do not mutually dissolve. In addition, the material Poly-TPD of the hole transport layer 60 is cross-linked and polymerized when it is fabricated, and therefore will not be dissolved by the solvent of the subsequent light emitting layer 70 to prevent miscibility.

Figure 5:
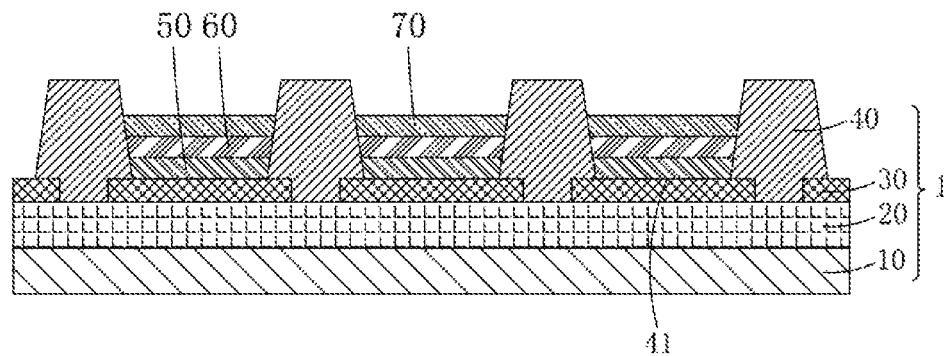
FIG. 5 is a schematic diagram of the step S4 of the manufacturing method of an all-solution OLED device of the disclosure.

In step S4, as shown in FIG. 5, an ink of the light emitting layer is provided. A solution film formation is performed respectively on the plurality of hole transport layers 60 in the plurality of openings 41 by ink-jet printing or coating, and a plurality of light emitting layers 70 are formed by drying and removing the solvent.

Specifically, the ink of the light emitting layer includes a light emitting layer material and a solvent, the material of the light emitting layer is a blue light emitting material, and the material of the blue light emitting layers includes poly (9,9-di-n-octylfluorenyl-2,7-diyl)(PFO), and the solvent is an organic solvent; preferably, the organic solvent includes one or more of toluene, chloroform, and chlorobenzene.

Preferably, the solution film-forming method of the plurality of light emitting layers 70 is ink-jet printing.

Specifically, the drying method of the plurality of light emitting layers 70 includes one or two of vacuum drying and heat drying; preferably, the drying method of the plurality of light emitting layers 70 is vacuum drying.

Specifically, the thickness of the plurality of light emitting layers 70 is between 1 nm and 100 nm.

Figure 6:
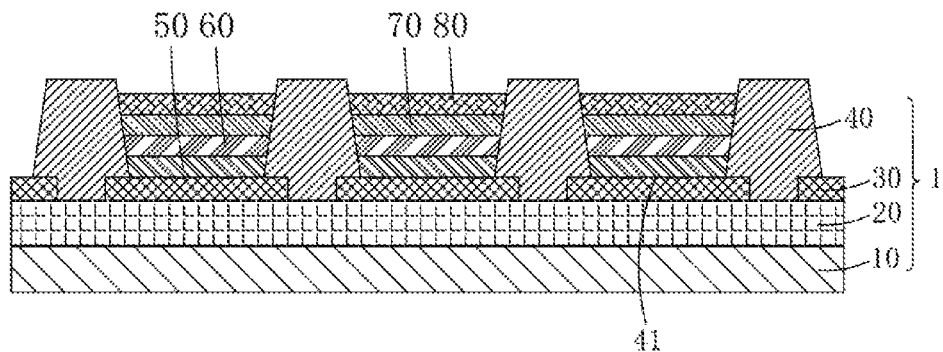
FIG. 6 is a schematic diagram of step S5 of the manufacturing method of an all-solution OLED device of the disclosure.

In step S5, as shown in FIG. 6, an ink of the electron transport layer is provided. A solution film formation is performed respectively on the plurality of light emitting layers 70 in the plurality of openings 41 by ink-jet printing or coating, and a plurality of electron transport layers 80 are formed by drying and removing the solvent;

the ink of the electron transport layer includes an electron transport layer material and a solvent, and the material of the electron transport layers is an ionic conjugated polyelectrolyte, and the solvent is an alcohol solvent.

The ionic conjugated polyelectrolyte is a soluble electron-transporting material that has been proved to have excellent electron transport properties in OLED and OPV (Organic Photovoltaic) devices and can significantly improve device performance.

Preferably, the ink of the electron transport layer further includes a viscosity modifier and a surface tension modifier to further adjust the physical properties of the ink and improve the printing effect.

Since the solvent for the material of the light emitting layer PFO is an organic solvent such as toluene, chloroform, and chlorobenzene, the cationic conjugated polyelectrolyte has an alcohol-soluble property and does not dissolve in an organic solvent such as toluene, chloroform, and chlorobenzene, and the material of the light emitting layer PFO does not dissolve in the alcohol solvent, and therefore, the electron transport layer 80 and the light emitting layer 70 do not mutually dissolve.

Preferably, the ionic conjugated polyelectrolyte is a cationic conjugated polyelectrolyte, and the cationic conjugated polyelectrolyte has a structural formula of

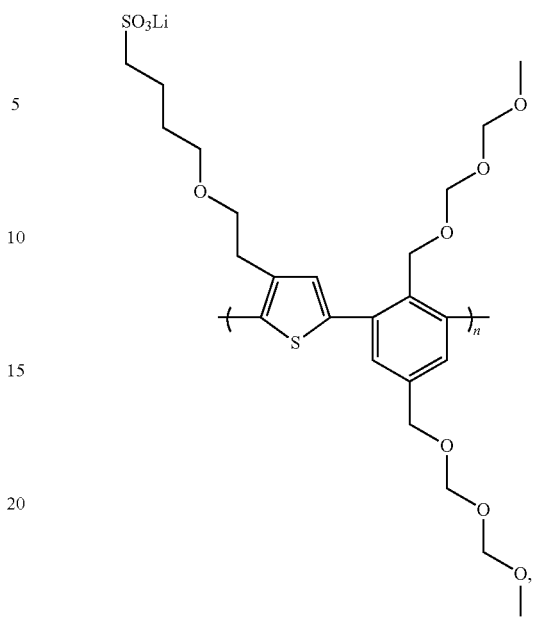

and the alcohol solvent is methanol.

Preferably, the solution film-forming method of the plurality of electron transport layers 80 is ink-jet printing.

Specifically, the drying method of the plurality of electron transport layers 80 includes one or two of vacuum drying and heat drying. Preferably, the drying method of a plurality of electron transport layers 80 is vacuum drying and then drying by heat.

Specifically, the thickness of the plurality of electron transport layers 80 is between 0.5 nm and 10 nm.

Figure 7:
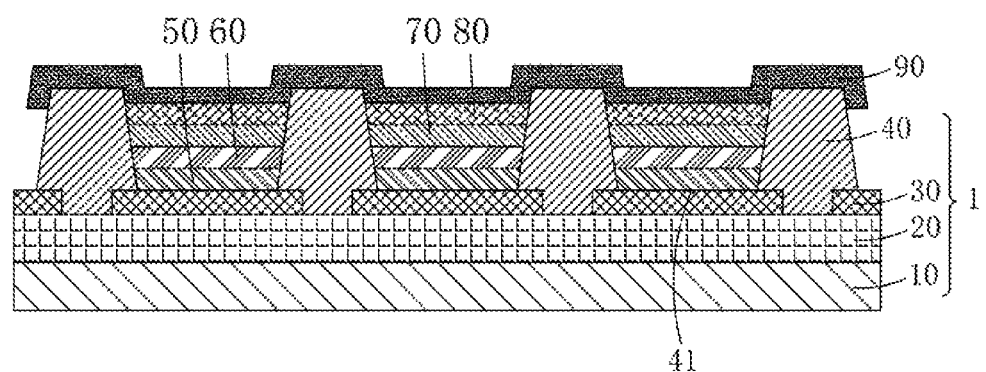
FIG. 7 is a schematic diagram of step S6 of the manufacturing method of an all-solution OLED device of the disclosure and is a schematic structural view of the all-solution OLED device of the disclosure.

In step S6, as shown in FIG. 7, a metal paste material is provided, and the entire surface of the electron transport layer 80 in the pixel definition layer 40 and the plurality of openings 41 is performed a solution film formation by ink-jet printing or coating, and a continuous uninterrupted cathode 90 by drying and removing the solvent;

the metal paste material includes metal microparticles, a binder, a solvent, and an auxiliary agent;

Preferably, the auxiliary agent is a viscosity regulator.

Preferably, the material of the metal microparticles is silver (Ag).

Preferably, the solution film forming method of the cathode 90 is ink-jet printing.

Specifically, the drying method of the cathode 90 includes one or two of vacuum drying and heat drying. Preferably, the drying method of the cathode 90 is vacuum drying.

Specifically, the thickness of the cathode 90 is between 10 nm and 200 nm.

Preferably, the top of the pixel definition layer 40 is a rough surface facilitating the attachment of the metal paste material to form a continuous uninterrupted cathode 90.

Specifically, in the solution film formation process of the hole injection layer 50, the hole transport layer 60, the light emitting layer 70, the electron transport layer 80 and the cathode 90, the coating method is spin coating or blade coating.

In the dry process of the hole injection layer 50, the hole transport layer 60, the light emitting layer 70, the electron transport layer 80, and the cathode 90, when the two adjacent structure layers are both dried by heating, the heating temperature of the structure layer of the back-end process is less than the heating temperature of the structural layer of the front-end process.

In the manufacturing method of the all-solution OLED device, the hole injection layer 50, the hole transport layer 60, the light emitting layer 70, the electron transport layer 80 and the cathode 90 are fabricated by the solution film-forming method. Compared with the manufacturing method of the existing OLED device, an all-solution fabrication of the electron transport layer 80 and the cathode 90 is achieved, the use of high vacuum evaporation process and equipment can be avoided, thereby saving materials and reducing manufacturing costs; and the adjacent layers will not appear mutual solubility, so the film quality is high and the performance of the device can be improved.

Referring to FIG. 7, the disclosure further provides an all-solution OLED device, including: a base substrate 10, a TFT array layer 20 disposed on the base substrate 10, a plurality of anodes 30 disposed on the TFT array layer 20 and disposed at intervals, a pixel definition layer 40 disposed on the TFT array layer 20 and the plurality of anodes 30, a plurality of openings 41 disposed on the pixel definition layer 40 and respectively corresponding to the plurality of anodes 30, a plurality of hole injection layers 50 respectively disposed in the plurality of openings 41 and located on the plurality of anodes 30, a plurality of hole transport layers 60 respectively disposed in the plurality of openings 41 and located on the plurality of hole injection layers 50, a plurality of light emitting layers 70 respectively disposed in the plurality of openings 41 and located on the plurality of hole transport layers 60, a plurality of electron transport layers 80 respectively disposed in the plurality of openings 41 and located on the plurality of light emitting layers 70, and a cathode 90 covered on an entire surface of the pixel definition layer 40 and the plurality of electron transport layers 80 and distributed continuously and uninterruptedly;

the hole injection layer 50, the hole transport layer 60, the light emitting layers 70, the electron transport layers 80, and the cathode 90 are all fabricated by the solution film-forming method.

The material of the plurality of electron transport layers 80 includes an ionic conjugated polyelectrolyte, and the material of the cathode 90 includes metal microparticles and a binder.

Specifically, the solution film formation method is ink-jet printing or coating, and the coating method is spin coating or blade coating.

Specifically, the areas of the openings 41 are respectively smaller than the areas of the plurality of anodes 30, ensuring that the bottoms of the openings 41 are covered with the anode material.

Specifically, the plurality of openings 41 respectively correspond to a plurality of pixel regions.

Specifically, the material of the plurality of anodes 30 is indium tin oxide(ITO). The plurality of anodes 30 are fabricated by way of magnetron sputtering film formation, and the film thickness of the plurality of anodes 30 is between 20 nm and 200 nm.

Specifically, the material of the hole injection layer includes PEDOT:PSS; and a thickness of the hole injection layers is between 1 nm and 100 nm.

Specifically, the material of the hole transport layer 60 includes poly(N'-bis (4-butylphenyl)-N,N'-bis(phenyl)-benzidine)(Poly-TPD); and a thickness of the plurality of hole transport layers is between 1 nm and 100 nm.

Specifically, the light emitting layer is a blue light emitting layer 70, the material of the blue light emitting layer include Poly (9,9-di-n-octylfluorenyl-2,7-diyl) (PFO); and a thickness of the plurality of light emitting layers is between 1 nm and 100 nm.

Preferably, the ionic conjugated polyelectrolyte is a cationic conjugated polyelectrolyte, and the cationic conjugated polyelectrolyte has a structural formula of

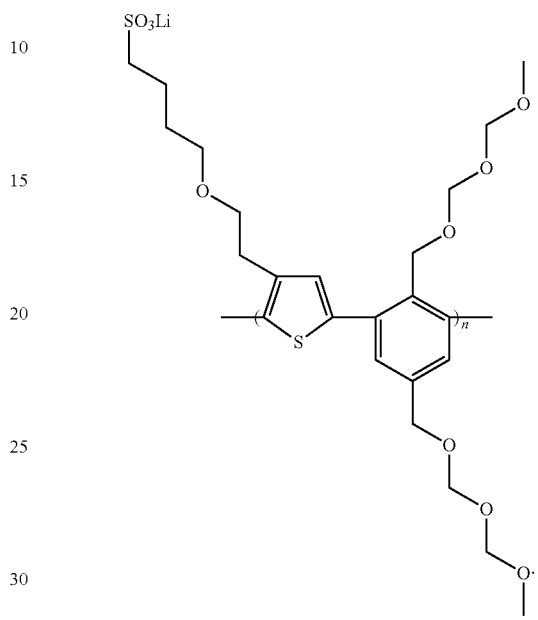

Specifically, the thickness of the plurality of electron transport layers 80 is between 0.5 nm and 10 nm.

Preferably, the material of the metal microparticles is silver (Ag).

Specifically, the thickness of the cathode 90 is between 10 nm and 200 nm.

Preferably, the top of the pixel definition layer 40 is a rough surface, facilitating to realize the attachment of the cathode 90 on the surface thereof.

The hole injection layer 50, the hole transport layer 60, the light emitting layer 70, the electron transport layer 80, and the cathode 90 in the all-solution OLED device are all fabricated by the solution film-forming method; compared with the existing OLED device, the fabrication cost is low, the film-forming quality is high, and the display quality is excellent.

In summary, the disclosure provides an all-solution OLED device and a manufacturing method thereof. The manufacturing method of the all-solution OLED device of the disclosure adopts the solution film-forming method to fabricate the hole injection layer, the hole transport layer, the light emitting layer, the electron transport layer and the cathode. Compared with the manufacturing method of the existing OLED device, an all-solution preparation of the electron transport layer and the cathode is achieved, the use of high vacuum evaporation process and equipment can be avoided, thereby saving materials and reducing manufacturing costs; and the adjacent layers will not appear mutual solubility, so the film quality is high and the performance of the device can be improved. The hole injection layer, the hole transport layer, the light emitting layer, the electron transport layer, and the cathode are all fabricated by solution film-forming; compared with the existing OLED device, the fabrication cost is low, the film-forming quality is high, and the display quality is excellent.

As described above, it will be apparent to those skilled in the art that various other changes and modifications may be made in accordance with the technical solutions and technical concepts of the disclosure, and all such changes and modifications are subject to be included in the scope of protection of the appended claims.

What is claimed is:

1. A manufacturing method of an all-solution OLED device, comprising:

providing a TFT backplane, wherein the TFT backplane comprises a base substrate, a TFT array layer disposed on the base substrate, a plurality of anodes disposed on the TFT array layer and disposed at intervals, and a pixel definition layer disposed on the TFT array layer and the plurality of anodes, wherein the pixel definition layer comprises a plurality of openings respectively corresponding to the plurality of anodes;

providing an ink of a hole injection layer, performing a solution film formation on the plurality of anodes in the plurality of openings respectively by ink-jet printing or coating, and forming a plurality of hole injection layers by drying and removing a solvent;

providing an ink of a hole transport layer, performing a solution film formation on the plurality of hole injection layers in the plurality of openings respectively by ink-jet printing or coating, and forming a plurality of hole transport layers by drying and removing a solvent;

providing an ink of a light emitting layer, performing a solution film formation on the plurality of hole transport layers in the plurality of openings respectively by ink-jet printing or coating, and forming a plurality of light emitting layers by drying and removing a solvent;

providing an ink of an electron transport layer, performing a solution film formation on the plurality of light emitting layers in the plurality of openings respectively by ink-jet printing or coating, and forming a plurality of electron transport layers by drying and removing a solvent;

wherein the ink of the electron transport layer comprises a material of the electron transport layer and a solvent thereof, and the material of the electron transport layers is an ionic conjugated polyelectrolyte, and the solvent is an alcohol solvent; and providing a metal paste material, performing an entire surface of solution film formation on the plurality of electron transport layers in the pixel definition layer and the plurality of openings respectively by ink-jet printing or coating, and forming a continuous uninterrupted cathode by drying and removing a solvent;

wherein the metal paste material comprises metal microparticles, a binder, a solvent, and an auxiliary agent.

2. The manufacturing method of the all-solution OLED device according to claim 1, wherein areas of the plurality of openings are respectively smaller than areas of the plurality of anodes; the plurality of openings respectively correspond to a plurality of pixel regions; a material of the plurality of anodes is indium tin oxide; the plurality of anodes are fabricated by way of magnetron sputtering film formation, and a film thickness of the plurality of anodes is between 20 nm and 200 nm;

wherein the ink of the hole injection layer is a PEDOT:PSS aqueous solution; a solution film-forming method of the plurality of hole injection layers is ink-jet printing; a drying method of the plurality of hole injection layers comprises one or two of vacuum drying and heat drying; and a thickness of the plurality of hole injection layers is between 1 nm and 100 nm.

3. The manufacturing method of the all-solution OLED device according to claim 1, wherein the ink of the hole transport layer comprises a material of the hole transport layer and a solvent thereof, the material of the hole transport layers is poly (N,N'-bis(4-butylphenyl)-N,N'-bis (phenyl) benzidine), and the solvent is an organic solvent; a solution film-forming method of the plurality of hole transport layers is ink-jet printing; a drying method of the plurality of hole transport layers comprises one or two of vacuum drying and heat drying; and a thickness of the plurality of hole transport layers is between 1 nm and 100 nm;

wherein the ink of the light emitting layer comprises a light emitting layer material and a solvent thereof, the material of the light emitting layer is a blue light emitting material, the material of the blue light emitting layers comprises poly(9,9-di-n-octylfluorenyl-2,7-diyl), and the solvent is an organic solvent; a solution film-forming method of the plurality of light emitting layers is ink-jet printing; a drying method of the plurality of light emitting layers comprises one or two of vacuum drying and heat drying; and a thickness of the plurality of light emitting layers is between 1 nm and 100 nm.

4. The manufacturing method of the all-solution OLED device according to claim 1, wherein the ionic conjugated polyelectrolyte is a cationic conjugated polyelectrolyte and the cationic conjugated polyelectrolyte has a structural formula of

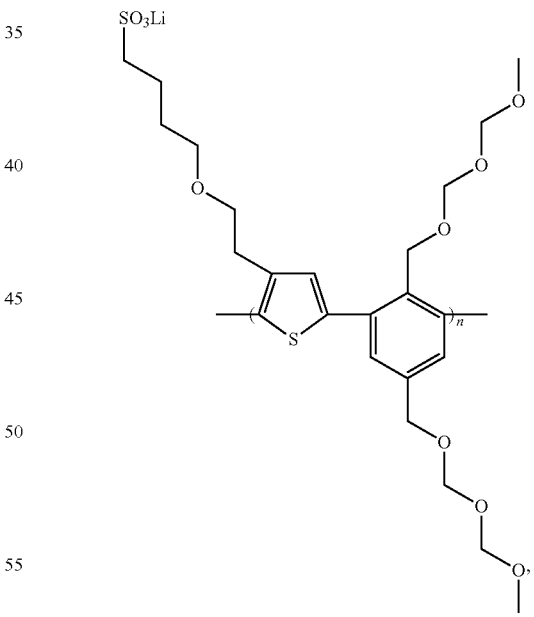

and the alcohol solvent is methanol;

wherein a solution film-forming method of the plurality of electron transport layers is ink-jet printing; a drying method of the plurality of electron transport layers comprises one or two of vacuum drying and heat drying; and a thickness of the plurality of electron transport layers is between 0.5 nm and 10 nm.

5. The manufacturing method of the all-solution OLED device according to claim 1, wherein a solution film-forming method of the plurality of anodes is ink-jet printing; a drying method of the plurality of anodes comprises one or two of vacuum drying and heat drying; a thickness of the plurality of anodes is between 10 nm and 200 nm; and a top of the pixel definition layer is a rough surface.

6. An all-solution OLED device, comprising:
a base substrate,
a TFT array layer disposed on the base substrate,
a plurality of anodes disposed on the TFT array layer and disposed at intervals,
a pixel definition layer disposed on the TFT array layer and the plurality of anodes,
a plurality of openings disposed on the pixel definition layer and respectively corresponding to the plurality of anodes,
a plurality of hole injection layers respectively disposed in the plurality of openings and located on the plurality of anodes,
a plurality of hole transport layers respectively disposed in the plurality of openings and located on the plurality of hole injection layers,
a plurality of light emitting layers respectively disposed in the plurality of openings and located on the plurality of hole transport layers,
a plurality of electron transport layers respectively disposed in the plurality of openings and located on the plurality of light emitting layers, and
a cathode covered on an entire surface of the pixel definition layer and the plurality of electron transport layers and distributed continuously and uninterruptedly;
wherein the plurality of hole injection layers, the plurality of hole transport layers, the plurality of light emitting layers, the plurality of electron transport layers, and the cathode are fabricated by a solution film-forming method;
wherein the material of the plurality of electron transport layers comprises an ionic conjugated polyelectrolyte; and a material of the cathode comprises metal microparticles and a binder.

7. The all-solution OLED device of claim 6, wherein areas of the plurality of openings are respectively smaller than areas of the plurality of anodes; the plurality of openings respectively correspond to a plurality of pixel regions; a material of the plurality of anodes is indium tin oxide; the plurality of anodes are fabricated by way of magnetron sputtering film formation, and a film thickness of the plurality of anodes is between 20 nm and 200 nm;
wherein a material of the hole injection layer comprises PEDOT:PSS; and a thickness of the hole injection layers is between 1 nm and 100 nm.

8. The all-solution OLED device of claim 6, wherein a material of the hole transport layer comprises poly (N,N'-bis(4-butylphenyl)-N,N'-bis(benzeneyl)benzidine); and a thickness of the plurality of hole transport layers is between 1 nm and 100 nm;
wherein the light emitting layer is a blue light emitting layer, and a material of the blue light emitting layer comprises poly(9,9-di-n-octylfluorenyl-2,7-diyl); and a thickness of the plurality of light emitting layers is between 1 nm and 100 nm.

9. The all-solution OLED device of claim 6, wherein the ionic conjugated polyelectrolyte is a cationic conjugated polyelectrolyte and the cationic conjugated polyelectrolyte has a structural formula of

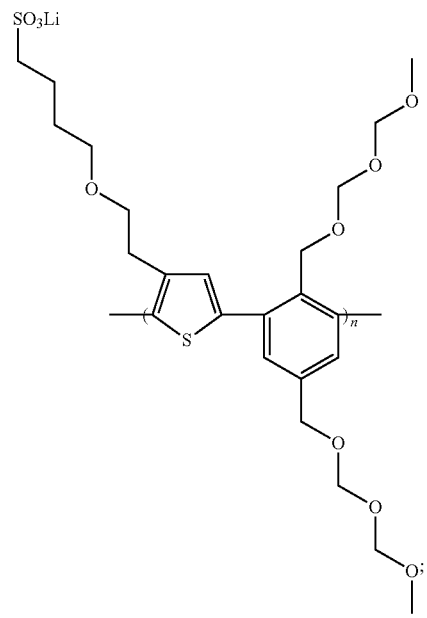

and a thickness of the plurality of electron transport layers is between 0.5 nm and 10 nm.

10. The all-solution OLED device of claim 6, wherein a material of the metal microparticles is silver; a thickness of the plurality of anodes is between 10 nm and 200 nm; and a top of the pixel definition layer is a rough surface.

11. An all-solution OLED device manufacturing method, comprising:
providing a TFT backplane, wherein the TFT backplane comprises a base substrate, a TFT array layer disposed on the base substrate, a plurality of anodes disposed on the TFT array layer and disposed at intervals, and a pixel definition layer disposed on the TFT array layer and the plurality of anodes, wherein the pixel definition layer comprises a plurality of openings respectively corresponding to the plurality of anodes;
providing an ink of a hole injection layer, performing a solution film formation on the plurality of anodes in the plurality of openings respectively by ink-jet printing or coating, and forming a plurality of hole injection layers by drying and removing a solvent;
providing an ink of a hole transport layer, performing a solution film formation on the plurality of hole injection layers in the plurality of openings respectively by ink-jet printing or coating, and forming a plurality of hole transport layers by drying and removing a solvent;
providing an ink of a light emitting layer, performing a solution film formation on the plurality of hole transport layers in the plurality of openings respectively by ink-jet printing or coating, and forming a plurality of light emitting layers by drying and removing a solvent;
providing an ink of an electron transport layer, performing a solution film formation on the plurality of light emitting layers in the plurality of openings respectively by ink-jet printing or coating, and forming a plurality of electron transport layers by drying and removing a solvent;
wherein the ink of the electron transport layer comprises a material of the electron transport layer and a solvent thereof, and the material of the electron transport layers is an ionic conjugated polyelectrolyte, and the solvent is an alcohol solvent;

providing a metal paste material, forming an entire surface of solution on the plurality of electron transport layers in the pixel definition layer and the plurality of openings respectively by ink-jet printing or coating, and forming a continuous uninterrupted cathode by drying and removing a solvent;

wherein the metal paste material comprises metal microparticles, a binder, a solvent, and an auxiliary agent;

wherein areas of the plurality of openings are respectively smaller than areas of the plurality of anodes; the plurality of openings respectively correspond to a plurality of pixel regions; a material of the plurality of anodes is indium tin oxide; the plurality of anodes are fabricated by way of magnetron sputtering film formation, and a film thickness of the plurality of anodes is between 20 nm and 200 nm;

wherein the ink of the hole injection layer is a PEDOT:PSS aqueous solution; a solution film-forming method of the plurality of hole injection layers is ink-jet printing; a drying method of the plurality of hole injection layers comprises one or two of vacuum drying and heat drying; and a thickness of the plurality of hole injection layers is between 1 nm and 100 nm;

wherein the ink of the hole transport layer comprises a material of the hole transport layer and a solvent thereof, the material of the hole transport layers is poly(N,N'-bis(4-butylphenyl)-N,N'-bis(phenyl)-benzidine), and the solvent is an organic solvent; a solution film-forming method of the plurality of hole transport layers is ink-jet printing; a drying method of the plurality of hole transport layers comprises one or two of vacuum drying and heat drying; and a thickness of the plurality of hole transport layers is between 1 nm and 100 nm;

wherein the ink of the light emitting layer comprises a material of the light emitting layer and a solvent thereof, the material of the light emitting layer is a blue light emitting material, wherein the material of the blue light emitting layers comprises poly(9,9-di-n-octylfluorenyl-2,7-diyl), and the solvent is an organic solvent; a solution film-forming method of the plurality of light emitting layers is ink-jet printing; a drying method of the plurality of light emitting layers comprises one or two of vacuum drying and heat drying; and a thickness of the plurality of light emitting layers is between 1 nm and 100 nm;

wherein the ionic conjugated polyelectrolyte is a cationic conjugated polyelectrolyte and the cationic conjugated polyelectrolyte has a structural formula of

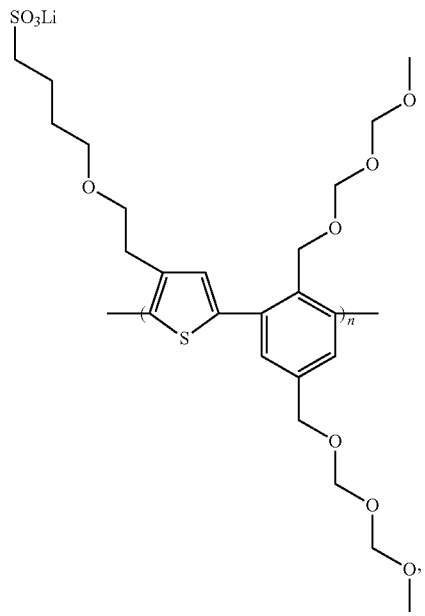

and the alcohol solvent is methanol;

wherein a solution film-forming method of the plurality of electron transport layers is ink-jet printing; a drying method of the plurality of electron transport layers comprises one or two of vacuum drying and heat drying; and a thickness of the plurality of electron transport layers is between 0.5 nm and 10 nm;

wherein a material of the metal microparticles is silver; a solution film-forming method of the plurality of anodes is ink-jet printing; a drying method of the plurality of anodes comprises one or two of vacuum drying and heat drying; a thickness of the plurality of anodes is between 10 nm and 200 nm; and a top of the pixel definition layer is a rough surface.

* * * * *